United States Patent
Abouzeid et al.

(10) Patent No.: US 8,565,030 B2
(45) Date of Patent: Oct. 22, 2013

(54) READ BOOST CIRCUIT FOR MEMORY DEVICE

(75) Inventors: Fady Abouzeid, Grenoble (FR); Sylvain Clerc, Grenoble (FR); Philippe Roche, Biviers (FR)

(73) Assignees: STMicroelectronics S.A., Montrouge (FR); STMicroelectronics (Crolles 2) SAS, Crolles (FR); Centre National de la Recherche Scientifique, Paris (FR)

( * ) Notice: Subject to any disclaimer, the term of this patent is extended or adjusted under 35 U.S.C. 154(b) by 144 days.

(21) Appl. No.: 13/240,861

(22) Filed: Sep. 22, 2011

(65) Prior Publication Data

US 2012/0081978 A1  Apr. 5, 2012

(30) Foreign Application Priority Data

Sep. 30, 2010 (FR) ...................................... 10/57945

(51) Int. Cl.
*G11C 7/00* (2006.01)

(52) U.S. Cl.
USPC ........................................ 365/189.15; 365/63

(58) Field of Classification Search
USPC .............................................. 365/189.15, 63
See application file for complete search history.

(56) References Cited

U.S. PATENT DOCUMENTS

| | | | |
|---|---|---|---|
| 6,191,620 B1 | 2/2001 | Lattimore | |
| 6,236,605 B1 * | 5/2001 | Mori et al. | 365/205 |
| 6,473,330 B1 * | 10/2002 | Ogiwara et al. | 365/145 |
| 7,324,394 B1 | 1/2008 | Yoon et al. | |
| 7,548,468 B2 * | 6/2009 | Kawabata et al. | 365/189.11 |
| 8,462,540 B2 * | 6/2013 | Chang et al. | 365/154 |
| 2007/0236984 A1 | 10/2007 | Zhang | |

OTHER PUBLICATIONS

French Search Report dated Apr. 27, 2011 from corresponding French Application No. 10/57945.
Written Opinion dated May 4, 2011 from corresponding French Application No. 10/57945.

* cited by examiner

*Primary Examiner* — Tuan T. Nguyen
(74) *Attorney, Agent, or Firm* — Wolf, Greenfield & Sacks, P.C.

(57) ABSTRACT

A read boost circuit arranged to boost the voltage difference between a pair of complementary bit lines of a memory device during a read operation, the read boost circuit including: a first transistor adapted to be controlled by the voltage level on a first bit line of the pair of bit lines to couple a second bit line of the pair of bit lines to a first supply voltage; and a second transistor connected directly to ground and adapted to be controlled by the voltage level on the second bit line to couple the first bit line to ground.

11 Claims, 3 Drawing Sheets

READ BOOST CIRCUIT FOR MEMORY DEVICE

CROSS REFERENCE TO RELATED APPLICATIONS

This application claims the priority benefit of French patent application number 10/75945, filed on Sep. 30, 2010, entitled a read boost circuit for memory device, which is hereby incorporated by reference to the maximum extent allowable by law.

BACKGROUND OF THE INVENTION

1. Field of the Invention

The present invention relates to a circuit and a method, and in particular to a circuit for improving the speed of read operations in a memory and to a method of performing the same.

2. Discussion of the Related Art

FIG. 1 illustrates a portion 100 of a memory device comprising complementary bit lines BL and $\overline{BL}$, and memory cells 102A, 102B coupled to bit line BL via corresponding transistors 104A and 104B, and to bit line $\overline{BL}$ via corresponding transistors 106A and 106B. When the memory cell 102A or 102B is to be read, the bit lines BL and $\overline{BL}$ are, for example, precharged with a high voltage level, and then the corresponding transistors 104A, 106A or 104B, 106B are activated by a corresponding control signal $S_A$, $S_B$ at their gate nodes. Depending on the bit value stored in the memory cell, the voltage on one or the other of the bit lines BL, $\overline{BL}$ will drop. Read circuitry 108 detects this voltage drop, and outputs the corresponding data $D_O$.

A common objective of such memory devices is to be able to perform relatively high speed memory read operations, in order to allow high read data rates from the memory. The speed of the read operation can be limited by the speed at which the voltage on the bit line BL or $\overline{BL}$ drops once the memory cell to be read has been coupled to the bit lines.

A further common objective of such memory devices is to provide high energy efficiency. One solution that has been proposed is the use of low or ultra low supply voltages, which reduce current consumption in the device.

However, the use of low supply voltages may have two main drawbacks. First, it can slow down the discharge of the bit lines during read operations, and thus reduces the speed of the read operations. Second, due to the lowered ratio between the dynamic and the leakage currents at low supply voltages, the voltage drop on BL and $\overline{BL}$ induced by the leakage from the memories that are not being read can be erroneously interpreted as a legitimate drop, leading to a read error due to the fact that the voltage drop on both lines BL and $\overline{BL}$ will be detected as dropping.

SUMMARY

It is an aim of the embodiments of the present disclosure to at least partially address one or more drawbacks in the prior art.

According to one aspect, there is provided a read boost circuit arranged to boost the voltage difference between a pair of complementary bit lines of a memory device during a read operation, the read boost circuit comprising: a first transistor adapted to be controlled by the voltage level on a first bit line of said pair of bit lines to couple a second bit line of said pair of bit lines to a first supply voltage; and a second transistor connected directly to ground and adapted to be controlled by the voltage level on the second bit line to couple said first bit line to ground.

According to one embodiment, the read boost circuit further comprises a third transistor adapted to be controlled by the voltage level of said first bit line to couple a control terminal of said second transistor to said second supply voltage.

According to another embodiment, the first transistor is activated by a low voltage of said first bit line, and said second transistor is activated by a high voltage of said second bit line.

According to another embodiment, said first transistor is a P-channel MOS transistor, and said second transistor is an N-channel MOS transistor.

According to another embodiment, the read boost circuit further comprises deactivation circuitry controllable to prevent said second transistor from coupling said first bit line to said second supply voltage.

According to another embodiment, said deactivation circuitry comprises a transistor, adapted to be controlled by a deactivation signal ($V_{BOOST}$), and coupled between said first transistor and a control terminal of said second transistor.

According to another embodiment, said deactivation circuitry comprises a further transistor coupled between a control terminal of said second transistor and said second supply voltage, and adapted to be controlled by a deactivation signal.

According to another embodiment, the read boost circuit further comprises: a fourth transistor adapted to be controlled by the voltage level on the second bit line to couple the first bit line to the first supply voltage; and a fifth transistor adapted to be controlled by the voltage level on the first bit line to couple the second bit line to the second supply voltage.

According to a further aspect, there is provided a memory device comprising a plurality of columns each comprising a plurality of memory cells coupled between a pair of complementary bit lines, and the above read boost circuit also coupled between said pair of bit lines.

According to a further aspect, there is provided an electronic device comprising the above memory device.

According to a further aspect, there is provided a method of boosting the voltage difference between a pair of complementary bit lines of a memory device during a read operation, the method comprising: coupling a memory cell of said memory device to said pair of complementary bit lines; based on the voltage level on a first bit line of said pair of bit lines, coupling by a first transistor a second bit line of said pair of bit lines to a first supply voltage; and based on the voltage level on the second bit line, coupling by a second transistor, connected directly to ground, the first bit line to ground.

BRIEF DESCRIPTION OF THE DRAWINGS

The foregoing and other purposes, features, aspects and advantages of the embodiments of the present disclosure will become apparent from the following detailed description, given by way of illustration and not limitation with reference to the accompanying drawings, in which.

DETAILED DESCRIPTION

In the following, only those aspects that are useful for an understanding of the present disclosure will be described in detail. Other features, such as the particular structure of the memory cells of the memory devices, will not be described, the invention being applicable to any type of memory cell that uses the voltage difference between two bit lines to implement a read operation.

Figure 1:
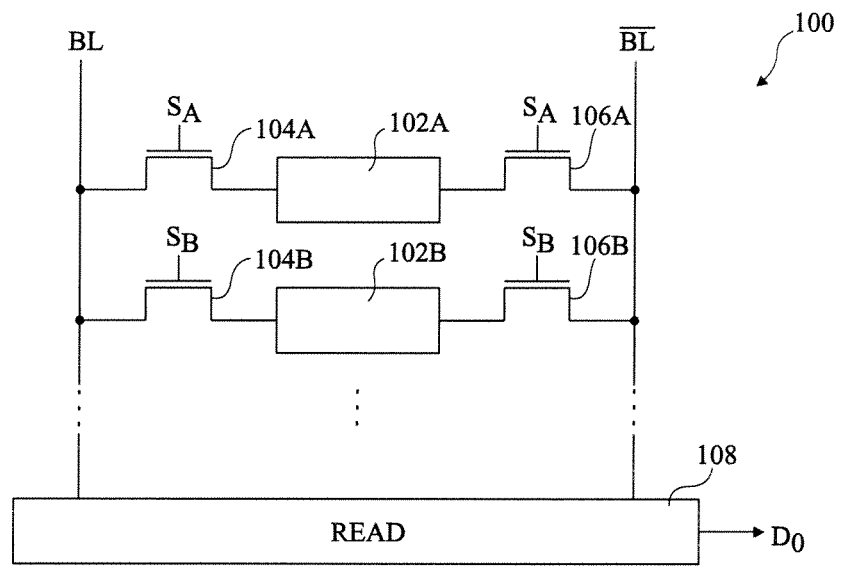
FIG. 1 (described above) schematically illustrates an example of a portion of a memory device.
Figure 2:
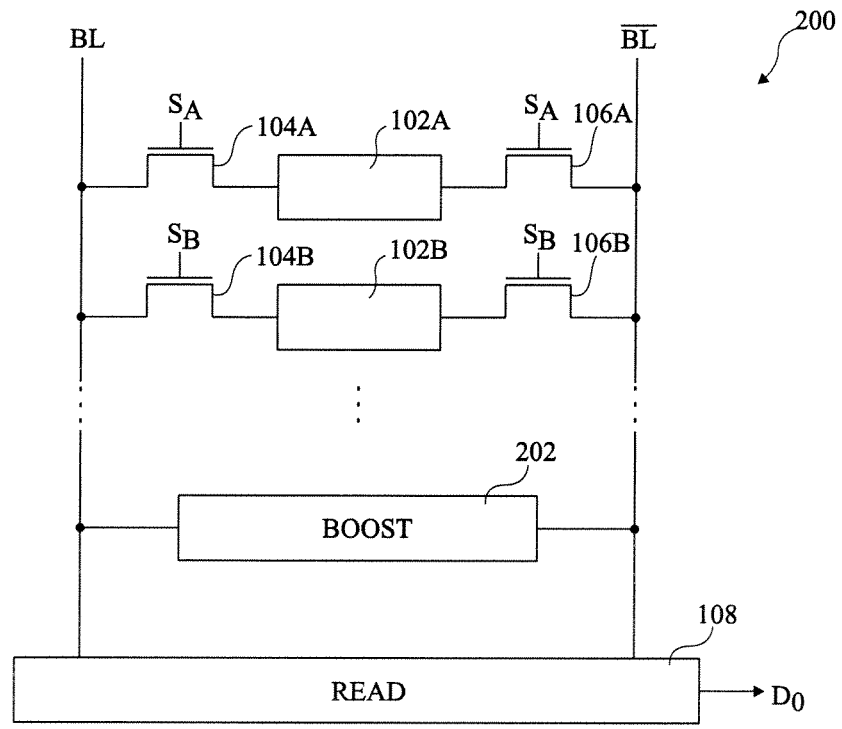
FIG. 2 schematically illustrates a portion of a memory device according to one embodiment.

FIG. 2 illustrates a portion 200 of a memory device, which is similar to portion 100 of FIG. 1 in that it comprises the same memory cells 102A, 102B and the bit lines BL and BL, along with the transistors 104A, 104B, 106A, 106B. Portion 200 additionally comprises a read boost circuit 202 coupled between the complementary bit lines BL and BL for boosting the voltage difference present on the bit lines BL and BL during a read operation, as will now be described in more detail with reference to the circuit diagrams of FIGS. 3 and 4.

Figure 3:
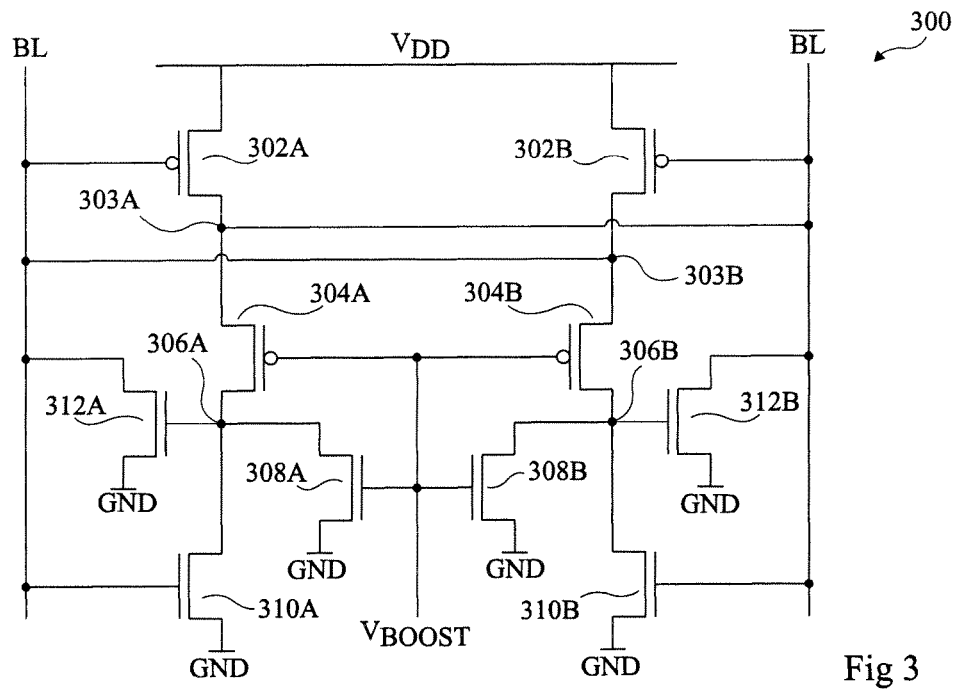
FIGS. 3 and 4 each schematically illustrate a read boost circuit of the memory device of FIG. 2 according to some embodiments.

FIG. 3 schematically illustrates an embodiment 300 of the read boost circuit 202 of FIG. 2.

The read boost circuit 300 comprises P-channel MOS (PMOS) transistors 302A and 302B each comprising a control terminal coupled to the bit lines BL and BL respectively. Transistor 302A is coupled between a supply voltage $V_{DD}$ and a node 303A, which is in turn coupled to the bit line BL and, via a PMOS transistor 304A, to a node 306A. Similarly, transistor 302B is coupled between the supply voltage $V_{DD}$ and a node 303B, which is in turn coupled to the bit line BL, and, via a PMOS transistor 304B, to a node 306B. Nodes 306A and 306B are coupled to ground via NMOS transistors 308A, 308B respectively, and via NMOS transistors 310A, 310B respectively. The control terminals of transistors 304A, 304B, 308A and 308B are controlled by a control voltage $V_{BOOST}$. The control terminals of transistors 310A, 310B are coupled to bit lines BL and BL respectively. Furthermore, an NMOS transistor 312A is coupled between the bit line BL and ground voltage GND, and has its control terminal coupled to the node 306A. Similarly, an NMOS transistor 312B is coupled between the bit line BL and ground voltage GND, and has its control terminal coupled to the node 306B.

The transistors 302A and 310A perform a preliminary reading of the state of the bit line BL, while transistors 302B and 310B perform a preliminary reading of the state of the bit line BL. In the case that bit line BL is low during a read operation, the transistors 302A and 312A also perform the role of enhancing this state, by applying the supply voltage $V_{DD}$ to bit line BL, and by coupling bit line BL to the ground voltage GND. Similarly, in the case that bit line BL is low during a read operation, the transistors 302B and 312B also perform the role of enhancing this state, by applying the supply voltage $V_{DD}$ to bit line BL, and by coupling bit line BL to the ground voltage GND. The term "enhance" is used herein to designate both an increase of a bit line voltage to the supply voltage, and the decrease of a bit line voltage to the ground level.

Additionally, deactivation circuitry is provided for deactivating this function. In the example of FIG. 3, the deactivation circuitry comprises transistors 304A, 304B, while transistors 308A and 308B hold the voltages of nodes 306A and 306B at the ground voltage when the boost function is deactivated.

Transistors 310A and 310B, which are optional, also provide the role of maintaining the voltage states at nodes 306A, 306B respectively at the ground voltage such that the enhancement of the bit line voltages is delayed until the bit line voltages have transitioned to a differential state.

In operation, the boosted read operation is implemented in three phases: activation, preliminary read, and enhancement.

The read boost circuit 300 is activated during a read operation by a low level of the control voltage $V_{BOOST}$, thereby activating transistors 304A and 304B, and deactivating transistors 308A, 308B. After charging the bit lines BL and BL at the start of the read operation, for example to the supply voltage $V_{DD}$, and activating the output of the memory cell to be read (not shown in FIG. 3), the voltage on either the bit line BL or bit line BL will start to drop, depending on the bit value being read.

Assuming that it is the voltage on bit line BL that drops, transistor 302A will be activated. This will apply the supply voltage $V_{DD}$ to bit line BL, and couple node 306A to the supply voltage $V_{DD}$ via transistor 304A, thereby applying a high voltage to the control terminal of transistor 312A. Transistor 312A will therefore be activated to couple the bit line BL to ground. At the same time, the transistor 310B will be activated by the high voltage on bit line BL, thereby also coupling the node 306B and the bit line BL to ground.

Assuming that it is the voltage on bit line BL that drops, transistor 302B will be activated. This will apply the supply voltage $V_{DD}$ to bit line BL, and couple node 306B to the supply voltage $V_{DD}$ via transistor 304B, thereby applying a high voltage to the control terminal of transistor 312B. Transistor 312B will therefore be activated to couple the bit line BL to ground. At the same time, the transistor 310A will be activated by the high voltage on bit line BL, thereby also coupling the node 306A and the bit line BL to ground.

Figure 4:
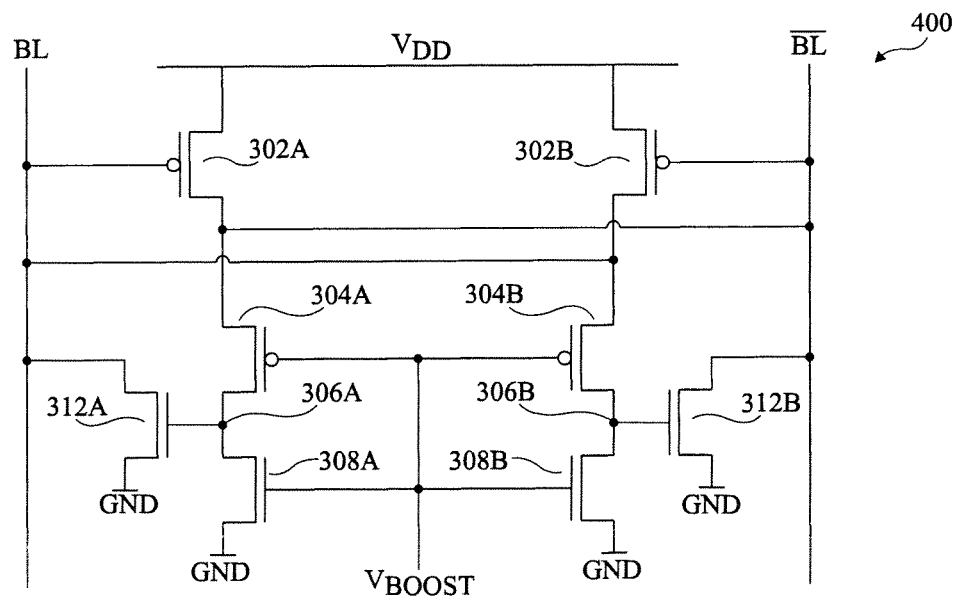

FIG. 4 illustrates an embodiment 400 of the read boost circuit 202 of FIG. 2, which is identical to the circuit 300 of FIG. 3, except that the transistors 310A and 310B are removed.

Operation of the circuit 400 of FIG. 4 is similar to that of circuit 300 of FIG. 3, except that, due to the removal of transistors 310A, 310B, during a read there will be no delay to the enhancement of the bit line voltages.

Figure 5:
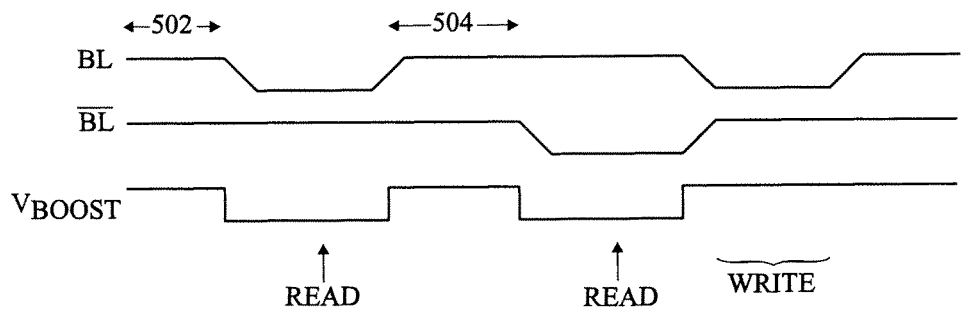
FIG. 5 is a timing diagram illustrating an example of signals of the read boost circuit of FIGS. 3 and 4 according to an embodiment.

FIG. 5 shows timing diagrams of the voltages BL, BL and $V_{BOOST}$ of the circuits of FIGS. 3 and 4 according to one example.

During an initial period 502, both the bit lines BL and BL are precharged with a high voltage, and the read boost circuitry is deactivated by a high level of the control voltage $V_{BOOST}$.

At the end of period 502, the control voltage $V_{BOOST}$ is brought low to activate the read boost circuitry, and a memory cell to be read is coupled to the bit lines BL and BL. In this example, the bit line BL goes low, and the speed of descent of this voltage is increased by the read boost circuitry. Due to current leakage from the other memory cells in the column that are not being read, the voltage on the bit line BL can also fall over time, but due to the coupling of transistors 302A, 302B to the bit lines BL and BL respectively, this phenomenon is avoided by coupling the bit line BL to the supply voltage. The voltages on the bit lines can then be read, as indicated by an arrow labelled "READ".

A subsequent read operation, for example of another memory cell, is then performed, by bringing high the control voltage $V_{BOOST}$ during a period 504, and precharging the bit lines BL and BL. Control voltage $V_{BOOST}$ is then brought low, and in this example it is the voltage of the bit line BL that then drops, the speed of descent being accelerated by the read boost circuitry.

A write operation is then performed by bringing the control signal $V_{BOOST}$ high, which allows a voltage swing to be applied to the bit lines BL and BL. In this example, a slightly negative voltage level is applied the bit line BL. The read boost circuitry is, for example, only activated during read operations.

Figure 6:
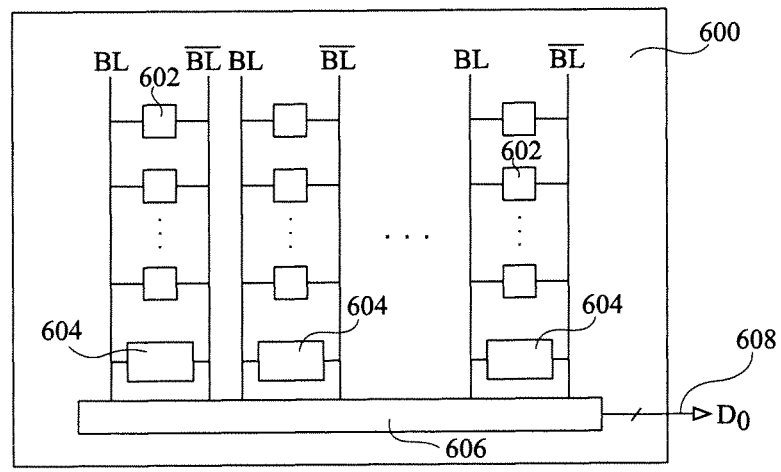
FIG. 6 illustrates a memory device according to an embodiment.

FIG. 6 illustrates a memory device 600 comprising an array of memory cells 602, arranged in columns between complementary bit lines BL and $\overline{BL}$. Each column comprises a corresponding read boost circuit 604 coupled to the complementary bit lines BL and $\overline{BL}$. Read circuitry 606 is coupled to each pair of bit lines, and provides a multibit output data value $D_0$ on an output line 608 of the memory.

The memory device 600 could be an SRAM (Static Random Access Memory), DRAM (Dynamic RAM), ROM (Read Only Memory), Flash memory, or other type of memory device using a difference between two bit lines to perform a read operation. The memory device 600 could correspond to a portable storage medium, hard disk drive, memory stick or memory card, on-board memory, or other type of electronic device with memory.

An advantage of the embodiments described herein is that the speed of the falling voltage on one of the bit lines during read operation is increased, at the same time as ensuring that the voltage on the other bit line does not also drop.

In particular, the transistors 312A, 312B are both connected directly between the respective bit lines BL, $\overline{BL}$ and the ground voltage GND. These transistors 312A, 312B drive the bit lines to the low voltage level faster than the transistors within the memory cell, such as cell 102A or 102B of FIG. 1. Indeed, the memory cell transistors are coupled in series with the transistors 104A, 104B, which lowers the bit line discharge time, particularly when low or ultra low supply voltages are used.

Furthermore, an advantage of the embodiments of FIGS. 3 and 4 is that, due to the direct coupling of transistors 312A and 312B to ground, these embodiments may be particularly adapted to low voltage or ultra low voltage applications, for example with the supply voltage $V_{DD}$ at between 0.2 V and 1.2 V.

Whilst a number of specific embodiments of the present invention have been described, it will be apparent to those skilled in the art that numerous alternatives and modifications could be applied.

For example, the timing diagram of FIG. 5 is merely an example, other timings of the voltages being possible during a read and write operation.

Furthermore, while the circuits 300 and 400 of FIGS. 3 and 4 comprise MOS transistors, in alternative embodiments other types of transistors could be used, or the NMOS transistors replaced by PMOS transistors and vice versa.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A read boost circuit arranged to boost a voltage difference between a pair of complementary bit lines of a memory device during a read operation, the read boost circuit comprising:
    a first transistor adapted to be controlled by the voltage level on a first bit line of said pair of bit lines to couple a second bit line of said pair of bit lines to a first supply voltage; and
    a second transistor connected directly to ground and adapted to be controlled by the voltage level on the second bit line to couple said first bit line to ground.

2. The read boost circuit of claim 1, further comprising a third transistor adapted to be controlled by the voltage level of said first bit line to couple a control terminal of said second transistor to said second supply voltage.

3. The read boost circuit of claim 1, wherein said first transistor is activated by a low voltage of said first bit line, and said second transistor is activated by a high voltage of said second bit line.

4. The read boost circuit of claim 1, wherein said first transistor is a P-channel MOS transistor, and said second transistor is an N-channel MOS transistor.

5. The read boost circuit of claim 1, further comprising deactivation circuitry controllable to prevent said second transistor from coupling said first bit line to said second supply voltage.

6. The read boost circuit of claim 5, wherein said deactivation circuitry comprises a transistor, adapted to be controlled by a deactivation signal, and coupled between said first transistor and a control terminal of said second transistor.

7. The read boost circuit of claim 6, wherein said deactivation circuitry comprises a further transistor coupled between a control terminal of said second transistor and said second supply voltage, and adapted to be controlled by a deactivation signal.

8. The read boost circuit of claim 1, further comprising:
    a fourth transistor adapted to be controlled by the voltage level on the second bit line to couple the first bit line to the first supply voltage; and
    a fifth transistor adapted to be controlled by the voltage level on the first bit line to couple the second bit line to the second supply voltage.

9. A memory device comprising a plurality of columns each comprising a plurality of memory cells coupled between a pair of complementary bit lines, and the read boost circuit of claim 1 also coupled between said pair of bit lines.

10. An electronic device comprising the memory device of claim 9.

11. A method of boosting the voltage difference between a pair of complementary bit lines of a memory device during a read operation, the method comprising:
    coupling a memory cell of said memory device to said pair of complementary bit lines;
    based on the voltage level on a first bit line of said pair of bit lines, coupling by a first transistor a second bit line of said pair of bit lines to a first supply voltage; and
    based on the voltage level on the second bit line, coupling by a second transistor, connected directly to ground, the first bit line to ground.

* * * * *